(12) United States Patent
Liao

(10) Patent No.: US 8,203,081 B2
(45) Date of Patent: Jun. 19, 2012

(54) PRINTED CIRCUIT BOARD PREFORM WITH TEST FACILITATING MEANS

(75) Inventor: Chang-Te Liao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 787 days.

(21) Appl. No.: 12/238,408

(22) Filed: Sep. 25, 2008

(65) Prior Publication Data

US 2009/0266597 A1  Oct. 29, 2009

(30) Foreign Application Priority Data

Apr. 28, 2008 (CN) .......................... 2008 1 0301368

(51) Int. Cl.
*H05K 1/11* (2006.01)
(52) U.S. Cl. ........ 174/261; 174/254; 174/260; 174/263; 361/720; 361/748; 361/760; 361/803; 257/776; 257/784; 257/786
(58) Field of Classification Search .................. 361/720, 361/748, 760, 761, 767, 772, 776, 777; 174/250, 174/254, 255, 257, 260–265, 268
See application file for complete search history.

(56) References Cited

U.S. PATENT DOCUMENTS

| 5,371,405 | A | * | 12/1994 | Kagawa | 257/664 |
| 6,147,869 | A | * | 11/2000 | Furnival | 361/719 |
| 6,313,532 | B1 | * | 11/2001 | Shimoishizaka et al. | 257/734 |
| 7,303,315 | B2 | * | 12/2007 | Ouderkirk et al. | 362/294 |
| 2004/0195687 | A1 | * | 10/2004 | Inoue et al. | 257/738 |
| 2005/0116235 | A1 | * | 6/2005 | Schultz et al. | 257/79 |
| 2009/0115041 | A1 | * | 5/2009 | Igarashi | 257/679 |
| 2009/0160053 | A1 | * | 6/2009 | Meyer et al. | 257/738 |

FOREIGN PATENT DOCUMENTS

JP  4-317388 A  11/1992

* cited by examiner

*Primary Examiner* — Courtney Smith
(74) *Attorney, Agent, or Firm* — Altis Law Group, Inc.

(57) ABSTRACT

An exemplary printed circuit board preform (20) includes at least two printed circuit board units (211), at least one boundary (201, 202) formed on the junction of the at least two printed circuit board units, and at least one conductor (206, 208) configured on a surface of the printed circuit board preform and crossing the at least one boundary of the at least two printed circuit board units.

11 Claims, 4 Drawing Sheets

PRINTED CIRCUIT BOARD PREFORM WITH TEST FACILITATING MEANS

BACKGROUND OF THE INVENTION

1. Field of the Invention

The disclosure relates to printed circuit board technology, and more particularly to a printed circuit board preform facilitating completion testing during manufacture.

2. Discussion of the Related Art

Printed circuit boards (PCB) are commonly employed as bases or carriers for circuit elements such as microprocessor chips, power die transistors, semiconductors or others. Because production of the printed circuit boards is complex and costly, a large printed circuit board preform is usually first produced. The printed circuit board preform is then separated, yielding a plurality of printed circuit boards of predetermined size using any conventional dividing device such as a puncher or a router.

FIG. 4 shows a typical printed circuit board preform 10. At least one V-cut 15 is defined in a surface thereof to guide separation into a plurality of printed circuit boards 11. The at least one V-cut 15 is defined in the surface of the printed circuit board preform 10 by a V-cut cutting process. Generally, detection of whether the V-cut cutting process has been successfully performed, the V-cut 15 is visually examined, a process prone to human error. As a result, poorly-cut printed circuit board preforms can often not be identified, and in subsequent process, cannot be successfully separated.

What is needed, therefore, is a printed circuit board preform that overcomes the described limitations.

SUMMARY

A printed circuit board preform includes at least two printed circuit board units, at least one boundary formed on the junction of thereof, and at least one conductor configured on a surface thereof crossing the at least one boundary.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present printed circuit board preform. Moreover, in the drawings, like reference numerals designate corresponding parts throughout the several views.

DETAILED DESCRIPTION OF THE EMBODIMENTS

Reference will now be made to the drawings to describe preferred embodiments of the present printed circuit board preform, in detail.

Figure 1:
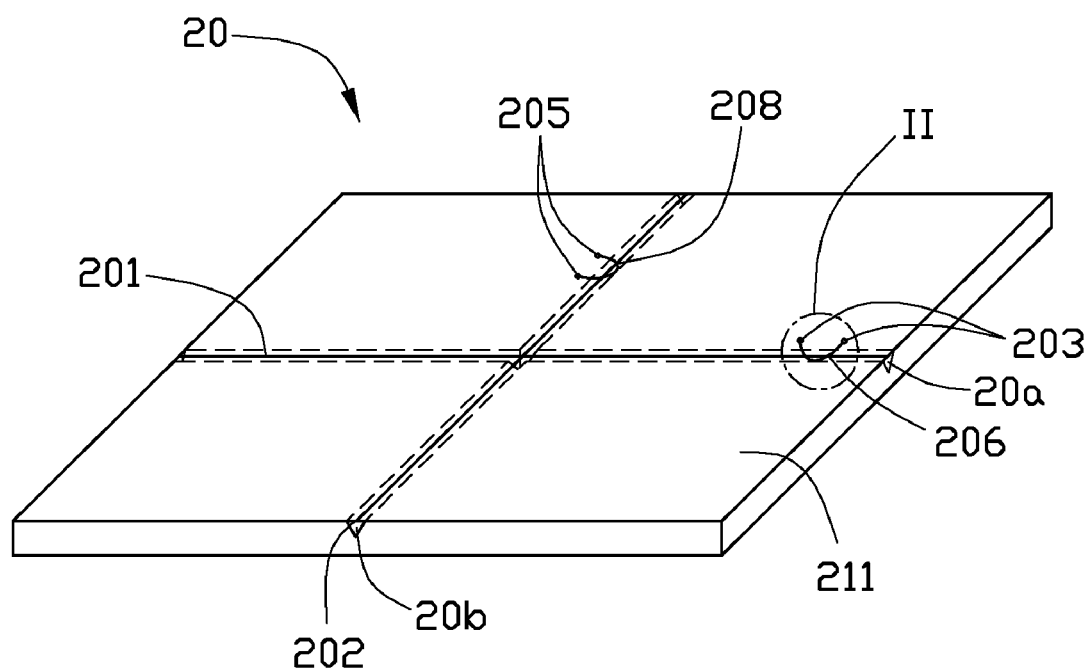
FIG. 1 is an isometric view of a printed circuit board preform in accordance with a first preferred embodiment.

Referring to FIG. 1, a printed circuit board preform 20 in accordance with a first preferred embodiment is shown. The printed circuit board preform 20 includes four printed circuit board units 211, two boundaries 201, 202, two conductors 206, 208, a pair of contacts 203, and a pair of second contacts 205.

Each of the four integrated printed circuit board units 211 can be separated from the printed circuit board preform 20, yielding a single printed circuit board. The boundaries 201, 202 are formed on the junctions 20a, 20b of the four printed circuit board units 211. The boundaries 201, 202 are substantially orthogonal to each other and run through the surface of the printed circuit board preform 20 horizontally and vertically correspondingly. In the V-cut cutting process, the V-cuts of the printed circuit board preform 20 are made along the boundaries 201, 202.

The two conductors 206, 208 are configured on the surface of the printed circuit board preform 20. Each of the conductors 206, 208 is substantially U-shaped and crosses over the corresponding boundaries 201, 202 into the adjacent printed circuit board unit 211 correspondingly. In the first preferred embodiment, the conductors 206, 208 are configured in a manner such that the ends of the conductors 206, 208 are on one side of the corresponding boundaries 201, 202, and the U-bends of the conductors 206, 208 are on the other side of the corresponding boundaries 201, 202. The conductors 206, 208 are metallic wires, and preferably copper. The diameter of each of the conductors 206, 208 is 0.1 mm to 0.15 mm, and preferably about 0.13 mm. The conductors 206, 208 are formed on the surface of the printed circuit board preform 20 via printing, with outer surfaces of the conductors 206, 208 processed by solder resisting.

First contacts 203, and second contacts 205 are formed on the ends of each of the conductors 206, 208 correspondingly. First contacts 203 are located on the same side of and adjacent to the boundary 201. Second contacts 205 are located on the same side of and adjacent to the boundary 202. First contacts 203 and second contacts 205 can be formed on the surface of the printed circuit board preform 20 via metal deposition, preferably tin or copper deposition. The outer surfaces of first contacts 203 and second contacts 205 are processed by solder resisting, in which a part of the outer surfaces of each of first contacts 203 and second contacts 205 need not be processed, exposing the metal for electrical conduction. First contacts 203 and second contacts 205 are substantially circular. The original diameter of each of first contacts 203 and second contacts 205 is about 0.8 mm, and after solder resisting, about 0.9 mm.

Figure 2:
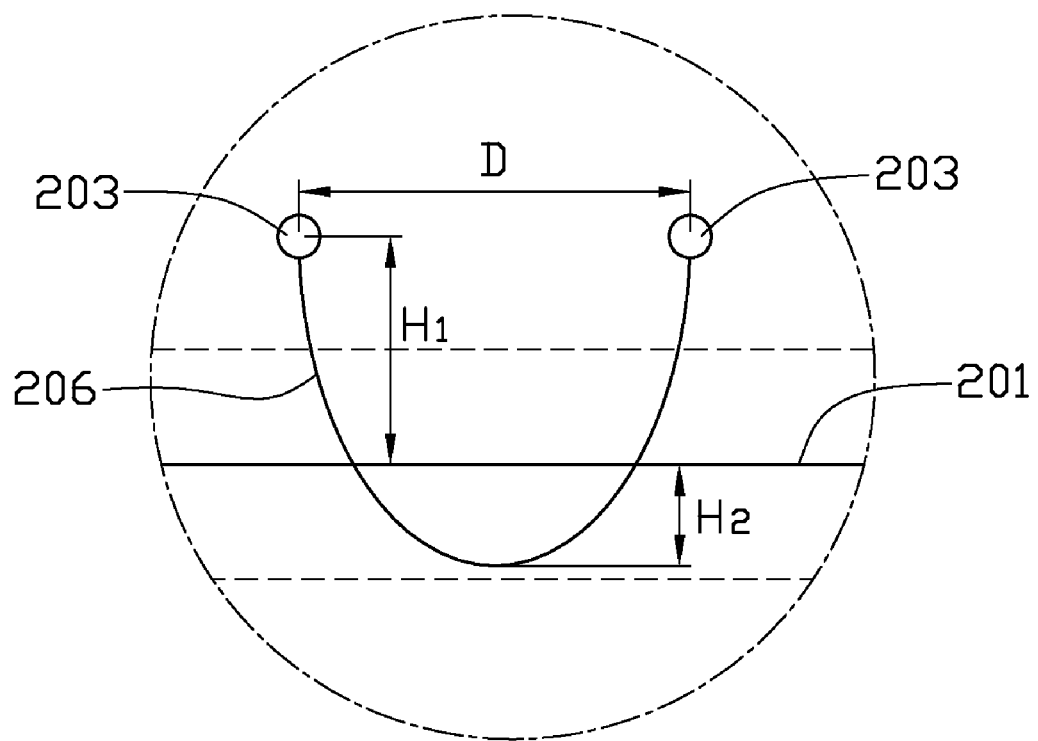
FIG. 2 is an enlarged, isometric view of a portion 11 of the printed circuit board preform in FIG. 1.

Referring to FIG. 2, the center distance D between the centers of the two contacts 203 is about 2.3 mm to 2.8 mm, and preferably about 2.5 mm. The displacement H1 between a center of the contacts 203 and the boundary 201 is about 0.9 mm. The maximum displacement H2 of conductor 206 crossing boundary 201 is about 0.3 mm. The dimensions of the two contacts 205, the boundary 202, and the conductor 208 are the same as those of the two contacts 203, the boundary 201, and the conductor 206.

When testing V-cut result on the printed circuit board preform 20, a conductivity test is performed on each of first contacts 203 and second contacts 205. If no current flows through the conductors 206, 208 between first contacts 203 and second contacts 205, V-cutting has been performed successfully, since a circuit path of each of the conductors 206, 208 crosses the corresponding boundaries 201, 202, during the V-cut process, and V-cutting of the printed circuit board preform 20 along the boundaries 201, 202, interrupts the circuit paths. Similarly, current through the conductors 206, 208 between first contacts 203 and second contacts 205 indicates that the V-cutting has been unsuccessful.

It should be understood that first contacts 203 and second contacts 205 are provided only for more convenient current testing, and can be omitted, in which case the conductivity test is performed on two ends of each of the conductors 206, 208 with results the same as previously disclosed.

Figure 3:
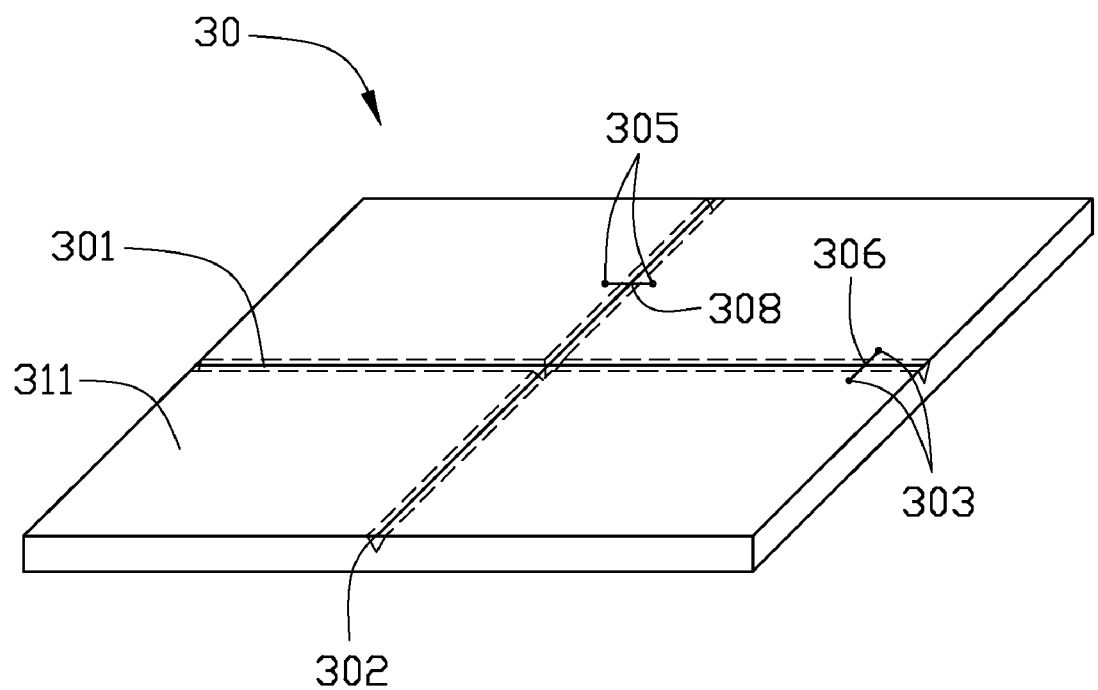
FIG. 3 is an isometric view of a printed circuit board preform in accordance with a second preferred embodiment.
Figure 4:
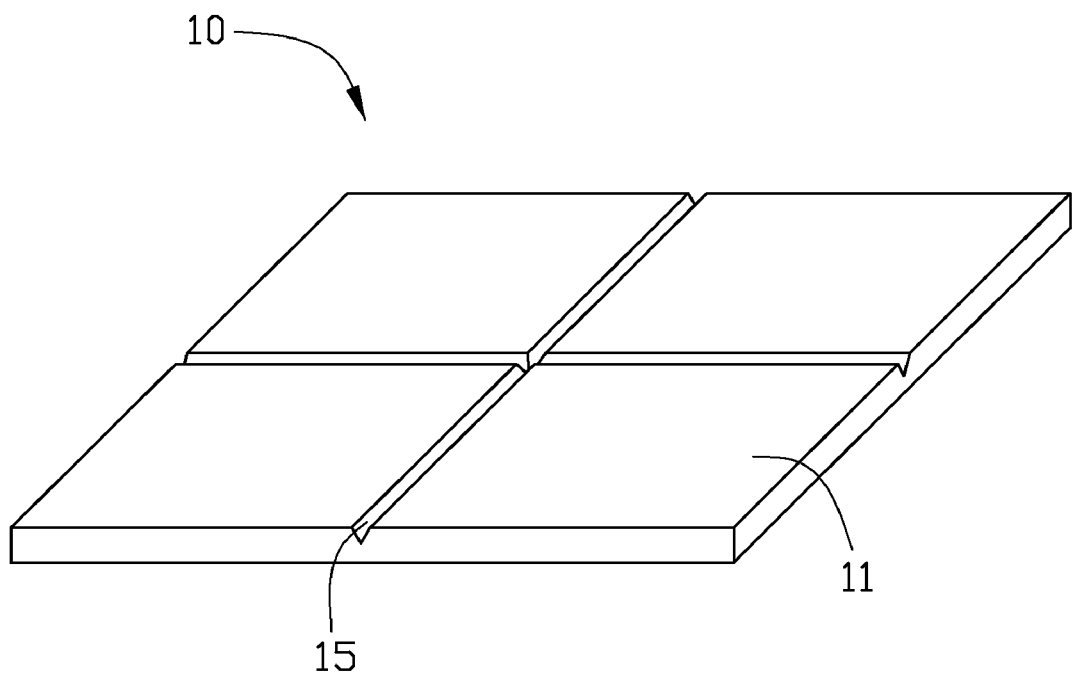
FIG. 4 is an isometric view of a conventional printed circuit board preform.

Referring to FIG. 3, a printed circuit board preform 30 in accordance with a second preferred embodiment is shown, differing from printed circuit board preform 20 only in that each of the two conductors 306, 308 substantially forms a straight line crossing the corresponding boundaries 301, 302 into the adjacent printed circuit board units 311. Contacts 303 are located on opposite sides of the boundary 301, and adjacent to the boundary 301, while contacts 305 are located on opposite sides of the boundary 302, and adjacent to the boundary 302.

It should be understood that the printed circuit board preform 20, 30 can include any number of printed circuit board units other than four, whereby a plurality of boundaries are included at the junctions 20a, 20b of the plurality of printed circuit board units. The number of conductors and contacts is determined by the number of boundaries. Each of the boundaries is crossed by at least one conductor, with one pair of contacts disposed on two ends of each of the at least one conductor.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A printed circuit board preform comprising:
   at least two printed circuit board units;
   at least one boundary formed at a junction of the at least two printed circuit board units;
   at least one conductor configured on a surface of the printed circuit board preform and crossing the at least one boundary of the at least two printed circuit board units, wherein the at least one conductor is substantially U-shaped and crosses over the at least one boundary into the adjacent printed circuit board unit correspondingly; and
   at least one pair of contacts formed on ends of the at least one conductor correspondingly, wherein the at least one conductor is configured in a manner such that the ends thereof are on one side of the at least one boundary, and a U-bend portion of the at least one conductor is on the other side of the at least one boundary.

2. The printed circuit board preform as claimed in claim 1, wherein the at least one pair of contacts is located on the same side of and adjacent to the at least one boundary.

3. The printed circuit board preform as claimed in claim 1, wherein the at least one conductor is metallic wires.

4. The printed circuit board preform as claimed in claim 3, wherein the at least one conductor is copper wires.

5. The printed circuit board preform as claimed in claim 4, wherein the diameter of a cross-section of the at least one conductor is 0.1 mm to 0.15 mm.

6. The printed circuit board preform as claimed in claim 3, wherein the at least one conductor is formed on the surface of the printed circuit board preform via printing, and the outer surface of the at least one conductor is processed by solder resisting.

7. The printed circuit board preform as claimed in claim 1, wherein the at least one pair of contacts is formed on the surface of the printed circuit board preform via metal deposition.

8. The printed circuit board preform as claimed in claim 7, wherein the at least one pair of contacts is formed on the surface of the printed circuit board preform via tin deposition or copper deposition.

9. The printed circuit board preform as claimed in claim 7, wherein the outer surfaces of the at least one pair of contacts are processed by solder resisting.

10. The printed circuit board preform as claimed in claim 9, wherein each of the at least one pair of contacts is substantially circular with an initial diameter of each about 0.8 mm, and after solder resisting, the diameter of each of the at least one pair of contacts is about 0.9 mm.

11. The printed circuit board preform as claimed in claim 1, wherein the distance between the centers of the at least one pair of contacts is about 2.3 mm to 2.8 mm; the displacement between a center of each of the at least one pair of contacts and the at least one boundary is about 0.9 mm; and the maximum displacement by which the at least one conductor crosses the at least one boundary is about 0.3 mm.

\* \* \* \* \*